United States Patent [19]

Schafft

[11] 4,035,671
[45] July 12, 1977

[54] PIEZOELECTRIC WIRE MATRIX PRINTER HEAD

[75] Inventor: Hugo Willy Schafft, Des Plaines, Ill.

[73] Assignee: Motorola, Inc., Schaumburg, Ill.

[21] Appl. No.: 658,443

[22] Filed: Feb. 17, 1976

[51] Int. Cl.² .................................... H01L 41/04
[52] U.S. Cl. ............................. 310/8.6; 346/141
[58] Field of Search ............. 310/8.1, 8.3, 8.5, 8.6, 310/9.1, 9.4; 346/141, 140; 197/1 R

[56] References Cited

U.S. PATENT DOCUMENTS

| | | | |
|---|---|---|---|
| 2,951,894 | 9/1960 | Hirsch | 346/140 X |
| 3,418,427 | 12/1968 | Jones | 346/141 X |
| 3,592,967 | 7/1971 | Harris | 310/8.6 UX |
| 3,596,116 | 7/1971 | Walton | 310/8.6 |

Primary Examiner—Mark O. Budd
Attorney, Agent, or Firm—James W. Gillman; Victor Myer; James P. Hamley

[57] ABSTRACT

A unique printer head employs a plurality of bimorph benders to drive a wire matrix. The benders are of the circular, high power type, having centrally located coupling washers. A housing supports the benders which are stackably mounted therein such that the washer openings form a central cavity which is aligned with an opening in the housing. Each wire couples to a corresponding bender to be ballistically driven thereby. The wires are routed through the central cavity and wire guides for actuation out the housing opening.

Because of the high efficiency of the bimorph bender drivers, the improved printer head has reduced size and weight, while maintaining a high reliability.

13 Claims, 2 Drawing Figures

PIEZOELECTRIC WIRE MATRIX PRINTER HEAD

BACKGROUND OF THE INVENTION

The present invention is directed to the printer head art, and, more particularly, to a wire matrix printer head employing piezoelectric drivers.

Printer heads of the wire matrix type are well known in the art, especially as used in computer or other machine activated printing devices. Conventional wire matrix print heads comprise a plurality of solenoids, each of which drives a particular wire in the wire matrix. In response to signals from the control machinery, selected wires in the matrix drive carbon paper against the printout paper, thereby leaving an identifying mark. The machine may produce either a coded printout, or conventional alphanumeric characters.

Due to the poor energy conversion efficiency of the magnetic solenoids, they have suffered numerous problems in application. To achieve the high accelerating forces necessary for rapid printouts, high currents must be passed through the solenoids which, therefore, must dissipate up to twenty watts of electrical power. This often results in overheating of the solenoids or, in the alternative, restricting the printing speeds to increase solenoid life. As a further alternative the solenoids may be made larger and heavier, thereby increasing cost, printer head size and weight.

A highly efficient transducer is the piezoelectric bimorph bender. However, until my recent invention, U.S. Pat. application Ser. No. 644,665, filed Dec. 24, 1975 and assigned to the same assignee as the instant application, such benders were not capable of the high accelerating forces required in printer head applications. Due to my development, however, the high power bimorph bender has become suited for high force, high acceleration applications.

OBJECTS OF THE INVENTION

It is an object of this invention, therefore, to provide an improved printer head which is capable of high accelerating forces while having a reduced size and weight.

It is a further object of the invention to provide an improved printer head as described above which is highly reliable in use.

It is also an object of the invention to provide an above-described printer head which employs high power bimorph benders.

Briefly, according to the invention, the printer apparatus includes a housing which is provided with an opening for the wire matrix. Stackably mounted within the housing are a plurality of bimorph benders. The benders are circular in shape, having a major surface which flexes in response to an applied electrical signal. Located in the central portion of the major surface is the central opening, which, preferably, contains a coupling washer. The benders are stackably mounted in the housing whereby their central openings form a central cavity which is in line with the housing opening. Each of a plurality of wire driven members is coupled to a corresponding one of the benders at the central opening. The wires are routed via spacers and guides through the central cavity to the housing opening.

In operation, electrical signals excite selected benders causing the benders to flex, thereby driving the wire member associated therewith out the housing opening.

DESCRIPTION OF THE PREFERRED EMBODIMENT OF THE INVENTION

Figure 1A:
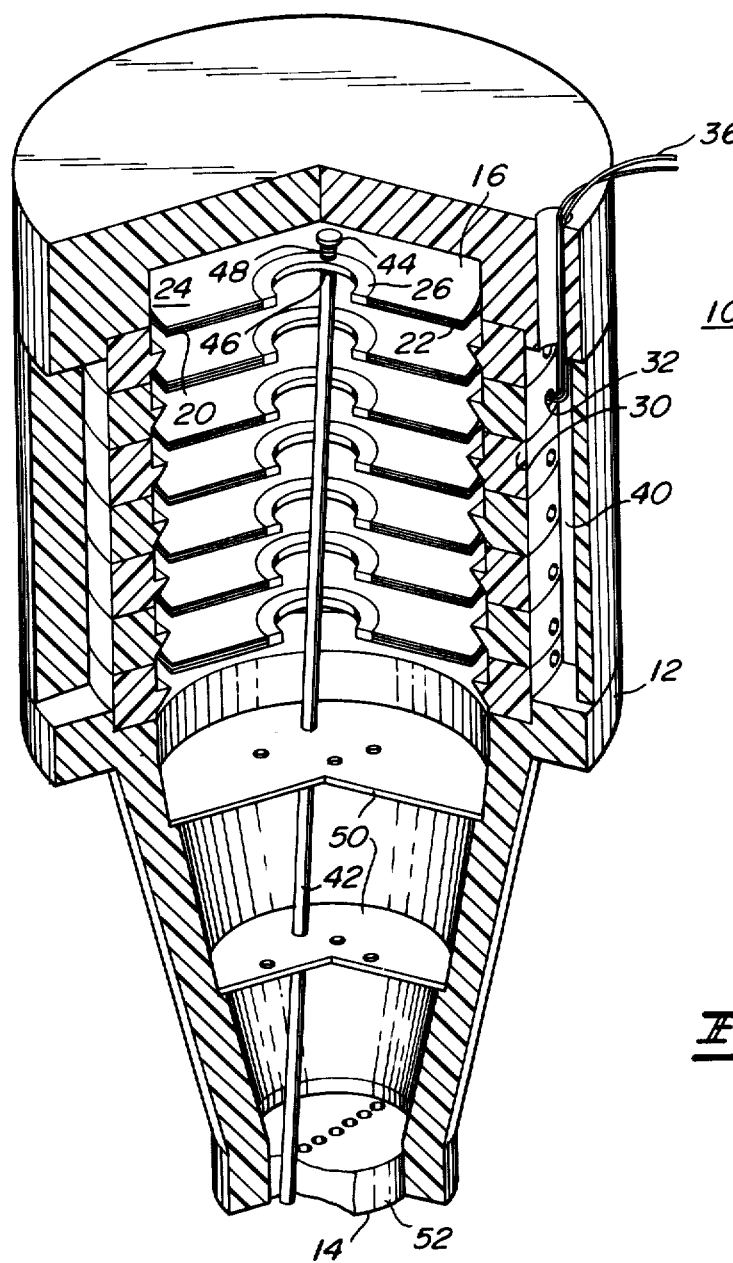
FIG. 1a is a cutaway perspective view of the piezoelectric printer head.

FIG. 1 is a cutaway perspective view of the wire matrix printer head according to the invention. The printer head 10 includes a housing 12 which is provided with a cylindrical upper chamber, and a tapered lower chamber terminating in a housing opening 14. While the housing may be fabricated from many materials, glass filled plastic is an excellent choice since it provides high mechanical integrity as well as electrical insulation to the assembly.

Figure 1B:
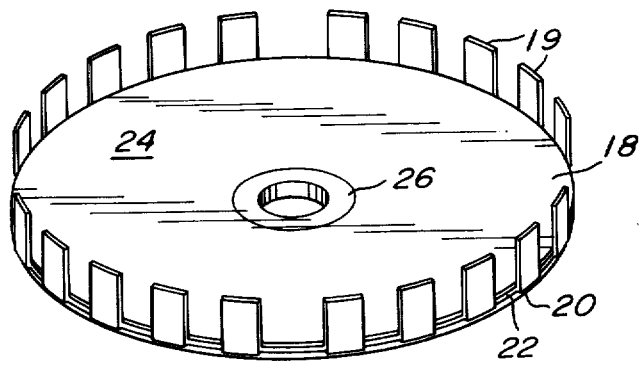
FIG. 1b is a perspective view of the high power bimorph bender.

Stackably mounted in the housing are a plurality of high power bimorph benders, one of which is indicated at 16, and an exploded view of which appears in FIG. 1b. Each bender is comprised of a pair of circular piezoelectric discs 18, 20 with a center vein 22 sandwiched therebetween. The major, or circular surface 24 of the bender flexes in response to electrical signals applied at electrodes deposited on the bender surface. For purposes of coupling to the bender, each major surface is provided with a central hole and, preferably, a coupling washer 26 mounted within the hole. A more thorough discussion of the high power bimorph bender may be found in my above-referenced application.

The center vein 22, preferably made of brass, of each bender is epoxied to a circular mounting ring 30, via a plurality of fingers, one of which is indicated at 19, formed in the center vein 22 and extending from the bimorph sandwich. The finger type mount allows bender deflection along its axis while restricting off axis movement. Mounting ring 30 is composed of a high stiffness material, such as glass filled plastic, and has an inner diameter suitable for encircling the major surface 24 of the bender 16 and an outer diameter adapted for insertion in the housing 12. An exit hole 32 in each ring 30 allows a means for routing electrical wires 36 to the benders.

In construction of the printer head, the bender 16 and ring 30 assemblies are stackably mounted in the cylindrical portion of the housing 12 such that the central openings are aligned to form a central cavity extending through the housing opening 14. A channel 40 is provided within the housing whereby the wires 36 are routed therethrough for connection externally thereof.

A tungsten wire driven member, such as the one indicated at 42, connects to each one of the benders 16. In the preferred construction, a hole is provided in the washer 26, which hole is adapted for routing the tungsten wire therethrough. The wire is provided with a head 44 and an anvil 46. A coil spring 48 mounts over the wire and elastically biases against the head 44 and the washer 26. Each wire 42 is routed through the central cavity formed by the central openings in the benders 16, through a pair of mounting guides 50 and, through a jewel wire guide 52 located at the housing opening 14.

In operation, electrical signals appearing on the wires 36 from associated control apparatus excites selected benders whereby they flex thereby driving the washer 26 against the anvil 46 thus activating the wire 42 out the opening 14 for engagement with the attendent printing mechanism. Due to the spring 48, the wire 42 is ballistically driven thus providing a high accelerating force and a precise rest state.

Since bimorph benders are highly efficient in operation, and since my improved bender is capable of high power operation, the resulting printer head is capable of high speed operation while having reduced weight and size over prior art printer heads. Also, the instant printer head is capable of high reliability in operation.

While a preferred embodiment of the invention has been described, it should be apparent that many modifications and variations thereto are possible, all of which fall within the true spirit of the invention.

I claim:

1. Apparatus comprising:
   a housing means provided with an opening;
   a plurality of bimorph benders, each bender having a major surface adapted for flexing in response to an applied electrical signal, and each blender being provided with a central opening through said major surface;
   means for stackably mounting the benders in the housing such that each bender is adapted to independently flex and for aligning the central openings to form a central cavity;
   a plurality of driven members;
   means for coupling each driven member to one of the bimorph benders for inducing driven member movement therewith in response to the flexing thereof; and
   means for routing the driven members through the central cavity for activation out the housing opening.

2. The apparatus of claim 1 wherein the housing is provided with a channel adapted for routing electrical connectors from outside the housing to the bimorph benders.

3. The apparatus of claim 1 wherein each bimorph bender has a circular major surface.

4. The apparatus of claim 3 wherein the central opening in each bimorph bender is provided by a circular washer affixed in the bender such that the axis of the washer is perpendicular to the major axis of the bender.

5. The apparatus of claim 3 wherein the stackably mounting means is comprised of a plurality of circular rings, each ring having an inner diameter adapted for concentrically enclosing the bimorph outer diameter, and having an outer diameter adapted for insertion within the housing.

6. The apparatus of claim 1 wherein each driven member is comprised of a predetermined length of wire.

7. The apparatus of claim 6 wherein the coupling means includes:
   a provided wire hole in each bender for passing the wire member therethrough;
   anvil means on said wire for contacting the bimorph bender when the wire is inserted in the wire hole; and
   bias means acting to elastically bias said wire member to be in contacting arrangement with said bimorph member.

8. The apparatus of claim 7 wherein said elastic bias means includes
   a head means provided on said wire, said head located to be on the opposite side of said wire hole from the anvil; and
   coil spring means adapted to have its axial length positioned over the wire with one end of said spring contacting the bimorph bender and the other spring end contacting the head means.

9. A wire matrix printer head assembly comprising in combination:
   a housing provided with an opening;
   a plurality of circular bimorph benders adapted for receiving electrical signals and producing a mechanical movement responsive thereto, each bender provided with a coupling washer predeterminedly located for movement with the bender in response to said applied electrical signals;
   mounting means for stackably mounting the benders in the housing such that each bender is adapted to independently flex and such that the central washers are in line with the housing opening thereby forming a central cavity;
   a plurality of wire members;
   coupling means for mechanically coupling one end of each wire member to a corresponding coupling washer; and
   guide means for routing the wires through the central cavity.

10. The apparatus of claim 9 wherein the housing is provided with a channel adapted for routing electrical connectors from outside the housing to the bimorph benders.

11. The apparatus of claim 9 wherein the mounting means is comprised of a plurality of circular rings, each ring having an inner diameter adapted for concentrically enclosing the bimorph bender outer diameter, and having an outer diameter adapted for inserting within the housing.

12. The apparatus of claim 9 wherein the coupling means includes:
   a provided wire hole in each coupling washer for passing the wire member therethrough;
   anvil means on said wire for contacting the coupling washer when the wire is inserted in the wire hole; and
   bias means acting to elastically bias said wire member to be in contacting arrangement with said coupling washer.

13. The apparatus of claim 12 wherein said elastic bias means includes
   a head means provided on said wire, said head located to be on the opposite side of said wire hole from the anvil; and
   coil spring means adapted to have its axial length positioned over the wire with one end of said spring connecting to the bimorph bender and the outer spring end contacting the head means.

* * * * *